(12) United States Patent
Gao

(10) Patent No.: US 12,557,242 B2
(45) Date of Patent: Feb. 17, 2026

(54) SELF-REGULATED AND SELF-POWERED FLUID MODULE FOR LIQUID COOLING

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 321 days.

(21) Appl. No.: 17/484,085

(22) Filed: Sep. 24, 2021

(65) Prior Publication Data
US 2023/0112559 A1 Apr. 13, 2023

(51) Int. Cl.
*H05K 7/20* (2006.01)
*F25B 21/02* (2006.01)

(52) U.S. Cl.
CPC ......... *H05K 7/20272* (2013.01); *F25B 21/02* (2013.01); *H05K 7/20254* (2013.01); *H05K 7/20772* (2013.01); *F25B 2321/023* (2013.01); *F25B 2321/0252* (2013.01)

(58) Field of Classification Search
CPC .......... H05K 7/20272; H05K 7/20254; H05K 7/20772; H05K 7/20781; F25B 21/02; F25B 2321/023; F25B 2321/0252
USPC .......................................................... 62/3.2
See application file for complete search history.

(56) References Cited

U.S. PATENT DOCUMENTS

| | | | | |
|---|---|---|---|---|
| 2,837,899 A | * | 6/1958 | Lindenblad | F25B 21/02 62/3.2 |
| 3,212,999 A | * | 10/1965 | Sommers, Jr. | B01D 5/0042 202/160 |
| 3,240,261 A | * | 3/1966 | Morales | F25B 21/02 126/362.1 |
| 3,252,504 A | * | 5/1966 | Newton | F24F 3/06 165/208 |
| 3,470,702 A | * | 10/1969 | Werner | F24F 5/0042 62/3.4 |

(Continued)

FOREIGN PATENT DOCUMENTS

| | | | | |
|---|---|---|---|---|
| CN | 104848564 A | * | 8/2015 | |
| GB | 2333352 A | * | 7/1999 | H10N 10/17 |

OTHER PUBLICATIONS

CN 104848564A, machine translation (Year: 2024).*

*Primary Examiner* — Eric S Ruppert
*Assistant Examiner* — Kirstin U Oswald
(74) *Attorney, Agent, or Firm* — WOMBLE BOND DICKINSON (US) LLP

(57) ABSTRACT

Embodiments are disclosed of a fluid delivery and distribution apparatus. The apparatus includes an energy-generating fluid distributor with a hot manifold including a hot chamber fluidly coupled to one or more fluid return inlets and a distributor return outlet, a cold manifold including a cold chamber fluidly coupled to a distributor supply inlet and one or more fluid supply outlets, and one or more thermoelectric devices sandwiched between the hot manifold and the cold manifold so that the thermoelectric device is in thermal contact with the hot chamber and in thermal contact with the cold chamber. The outlet of a main supply line is fluidly coupled to the distributor supply inlet, and the main supply line has a pump fluidly coupled therein that is electrically coupled to the thermoelectric device. The outlet of a main return line is fluidly coupled to the distributor return outlet.

20 Claims, 11 Drawing Sheets

(56) References Cited

U.S. PATENT DOCUMENTS

| | | | | |
|---|---|---|---|---|
| 3,899,359 | A * | 8/1975 | Stachurski | H10N 10/13 136/218 |
| 4,281,516 | A * | 8/1981 | Berthet | H10N 10/17 62/3.3 |
| 4,459,428 | A * | 7/1984 | Chou | H10N 10/17 136/211 |
| 4,829,771 | A * | 5/1989 | Koslow | F25B 21/02 62/3.64 |
| 5,590,532 | A * | 1/1997 | Bachman | B67D 1/0869 62/3.3 |
| 6,434,955 | B1 * | 8/2002 | Ng | F25B 25/00 62/480 |
| 7,954,331 | B2 * | 6/2011 | Ullman | F25B 21/02 62/3.2 |
| 8,341,950 | B2 * | 1/2013 | Bidner | F01N 5/025 136/202 |
| 8,445,772 | B2 * | 5/2013 | Bell | F01P 9/06 136/200 |
| 9,103,573 | B2 * | 8/2015 | Goenka | B60H 1/00478 |
| 9,310,112 | B2 * | 4/2016 | Bell | B60H 1/00271 |
| 9,504,189 | B1 * | 11/2016 | Campbell | H05K 7/20127 |
| 10,912,230 | B1 * | 2/2021 | Gao | H05K 7/20645 |
| 11,031,535 | B2 * | 6/2021 | Hatasako | H01L 23/46 |
| 2002/0148235 | A1 * | 10/2002 | Bell | H10N 10/13 136/204 |
| 2004/0025516 | A1 * | 2/2004 | Van Winkle | H10N 10/13 62/3.61 |
| 2006/0137359 | A1 * | 6/2006 | Ghoshal | H10N 10/13 62/3.2 |
| 2007/0101740 | A1 * | 5/2007 | Akei | H10N 10/00 62/238.7 |
| 2007/0199333 | A1 * | 8/2007 | Windisch | A41D 13/0051 62/3.5 |
| 2008/0028768 | A1 * | 2/2008 | Goenka | B60H 1/00478 62/3.61 |
| 2008/0110179 | A1 * | 5/2008 | Rice | B60H 1/00478 62/3.2 |
| 2009/0301541 | A1 * | 12/2009 | Watts | H10N 10/00 136/205 |
| 2012/0111386 | A1 * | 5/2012 | Bell | H10N 10/00 700/297 |
| 2012/0169067 | A1 * | 7/2012 | Ruan | F24H 4/06 290/1 R |
| 2013/0091868 | A1 * | 4/2013 | Campbell | H05K 7/203 62/3.2 |
| 2018/0183380 | A1 * | 6/2018 | Gustafson | H10N 10/80 |

* cited by examiner

SELF-REGULATED AND SELF-POWERED FLUID MODULE FOR LIQUID COOLING

TECHNICAL FIELD

The disclosed embodiments relate generally to information technology (IT) liquid cooling systems, and in particular, but not exclusively, to a self-regulated and self-powered fluid delivery and distribution system for use in a liquid cooling system.

BACKGROUND

Modern data centers like cloud computing centers house enormous amounts of information technology (IT) equipment such as servers, blade servers, routers, edge servers, power supply units (PSUs), battery backup units (BBUs), etc. These individual pieces of IT equipment are typically housed in racks within the computing center, with multiple pieces of IT equipment in each rack. The racks are typically grouped into clusters within the data center.

As IT equipment has become more computationally powerful it also consumes more electricity and, as a result, generates more heat. This heat must be removed from the IT equipment to keep it operating properly. To keep up with this increasing need for heat removal, IT equipment has incorporated internal liquid cooling systems and, at the same time, the IT racks in which IT equipment is housed have incorporated rack-level liquid cooling systems that interface with the internal liquid cooling systems of the IT equipment.

Existing liquid-cooling systems use pumps to deliver cooling fluid to the cooling system and manifolds to distribute the cooling fluid to heat-generating components, but in existing solutions each component is separate from the other and performs only a single function: the pump pumps fluid, the manifolds distribute the fluid, and that is all they do.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2A is an exploded view, FIG. 2B an assembled view.

DETAILED DESCRIPTION

Figure 1:
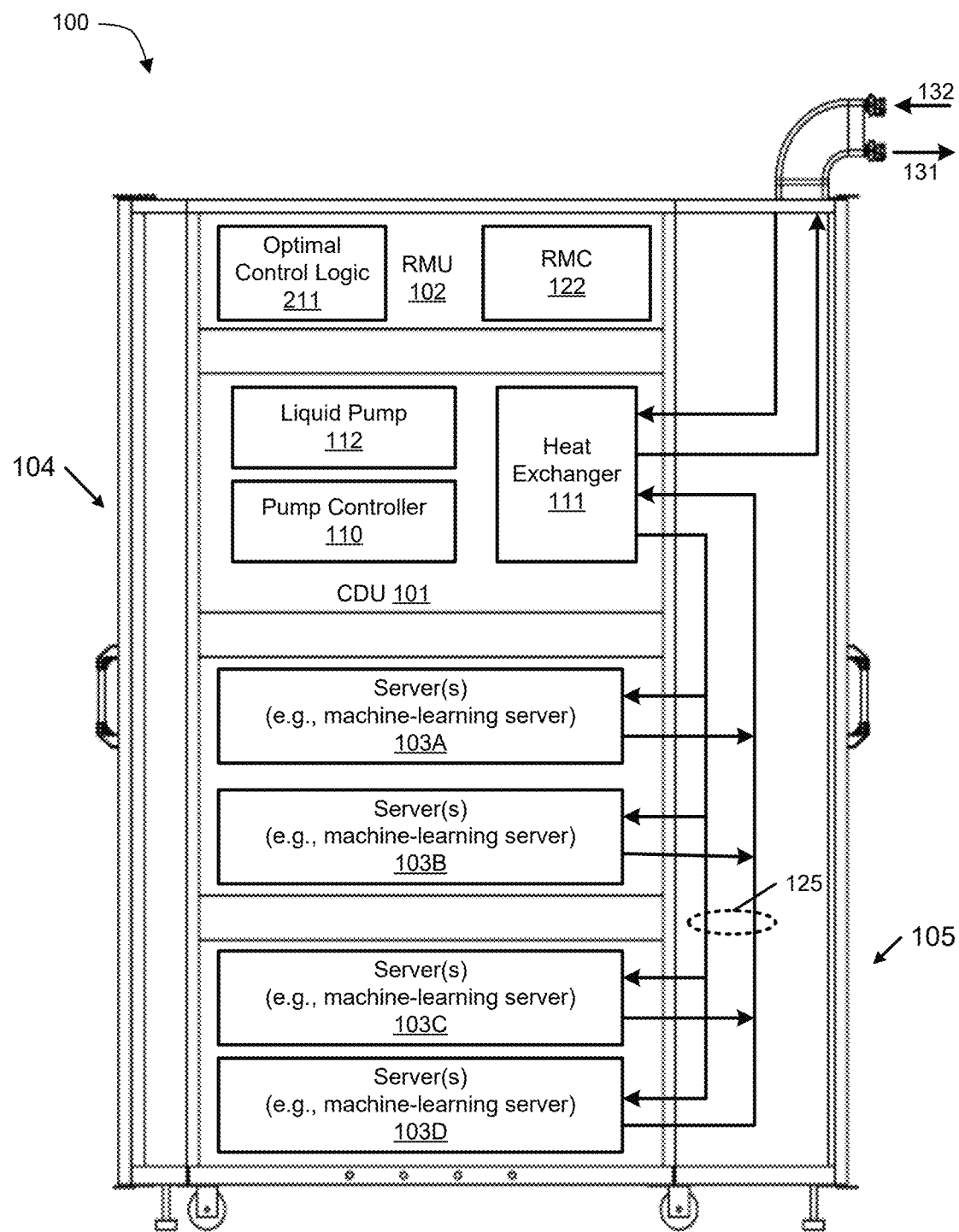
FIG. 1 is a side view of an embodiment of a liquid-cooled information technology (IT) rack populated with various pieces of IT equipment.

Embodiments are described of a fluid delivery and distribution system for use with a piece of information technology (IT) equipment such as a server in an IT rack. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require a particular orientation of the described embodiments when in actual use.

Embodiments are described below of a fluid delivery and distribution system that enables self-regulated and self-powered operation of liquid cooling in a server. The embodiments not only enable high-efficiency operation of fluid cooling in a server, but also high-efficiency operation of the overall cooling system of data centers. The described embodiments also enable some or all of the following features:

High efficiency design for servers and data centers.
Significantly increase server operation efficiency.
Self-regulation and self-sensing design.
Does not require use of external power.
Compatible with existing rack and IDC systems, both cooling and power.
Compatible with existing hardware design of fluid management units.
Localized fluid acceleration design.
Customized fluid recirculation acceleration without any sensor.
Accommodate different server architectures.

The described embodiments include a fluid delivery module and a fluid distributor that together enable fluid acceleration and distribution with a self-sensing, self-regulating, and self-powered design. The embodiments include a thermoelectric device (TED) layer packaged between two fluid manifolds. The TED is connected to a dedicated pump added into the fluid loop. The pump can be used for pumping the fluid in an active loop or can be used as a boost pump in a passive loop. In one embodiment, the system is designed with a fluid delivery module and a fluid distributor that are connected with fluid connectors and power connectors. In an embodiment, the acceleration module includes one additional power port to connect with renewable power source. In an embodiment, the fluid distributor can include an additional power output port for additional devices.

According to one aspect, an apparatus includes an energy-generating fluid distributor. The fluid distributor includes a hot manifold including a hot chamber fluidly coupled to one or more fluid return inlets and a distributor return outlet, a cold manifold including a cold chamber fluidly coupled to a distributor supply inlet and one or more fluid supply outlets, and a thermoelectric device sandwiched between the hot manifold and the cold manifold and in thermal contact with the hot chamber and in thermal contact with the cold chamber. The apparatus further includes a main supply line having a supply line inlet and a supply line outlet fluidly coupled to the distributor supply inlet, and a main return line having a return line inlet and a return line outlet fluidly coupled to the distributor return outlet.

In an embodiment, the main supply line includes a pump fluidly coupled therein, the pump being electrically coupled to the thermoelectric device. The pump is a boost pump coupled in a bypass line, wherein ends of the bypass line are fluidly coupled to the main supply line or wherein the ends of the bypass line are fluidly coupled to the main return line. The pump is an active pump directly coupled in the main supply line or the main return line. The main supply line, the pump, and the main return line are grouped in a fluid delivery module separate from the energy-generating fluid distributor. The fluid delivery module further comprises fluid couplings coupled to at least the supply line outlet and the return line inlet, wherein the fluid couplings is adapted to couple the supply line outlet to the distributor supply inlet and couple the return line inlet to the distributor return outlet.

In an embodiment, the fluid delivery module further comprises at least one pump power connector electrically coupled to the pump and adapted to connect with a corresponding connector on the fluid distributor that is electrically coupled to the thermoelectric device. The supply line outlet and the return line inlet are coupled to the energy-generating fluid distributor using standard electrical and fluid connectors. The fluid distributor includes one or more additional power connectors coupled to the thermoelectric device and adapted to be coupled with corresponding connectors of additional electrically-powered cooling components.

In an embodiment, the apparatus further includes a liquid-to-air heat exchanger coupled to the supply line inlet and the return line outlet, the liquid-to-air heat exchanger including a fan coupled one of the additional power connectors of the fluid distributor. The thermoelectric device is further electrically coupled to an external renewable power source. The thermoelectric device is further electrically coupled to a renewable energy storage unit in a server in which the energy-generating fluid distributor is located.

According to another aspect, a cooling system includes one or more cold plates adapted to be thermally coupled to a corresponding one of one or more heat-generating components in a piece of information technology (IT) equipment, each cold plate having a fluid inlet and a fluid outlet, an energy-generating fluid distributor as described above, one or more cooling loops formed by fluidly coupling at least one of the one or more cold plates to the cold chamber though a fluid supply outlet and to the hot chamber through a fluid return inlet, a main supply line having a supply line inlet and a supply line outlet fluidly coupled to the distributor supply inlet, and a main return line having a return line inlet and a return line outlet fluidly coupled to the distributor return outlet.

FIG. 1 is a block diagram illustrating a side view of an embodiment of an information technology (IT) rack, which is a type of IT container commonly used in data centers. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Rack 100 is an example of an IT rack in which embodiments of a fluid delivery and distribution system, such as the ones shown in FIGS. 4A-4B et seq., can be used.

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit. The power supply unit can include the necessary circuitry (e.g., an alternating current (AC) to direct current (DC) or DC to DC power converter, battery, transformer, or regulator, etc.) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2A:
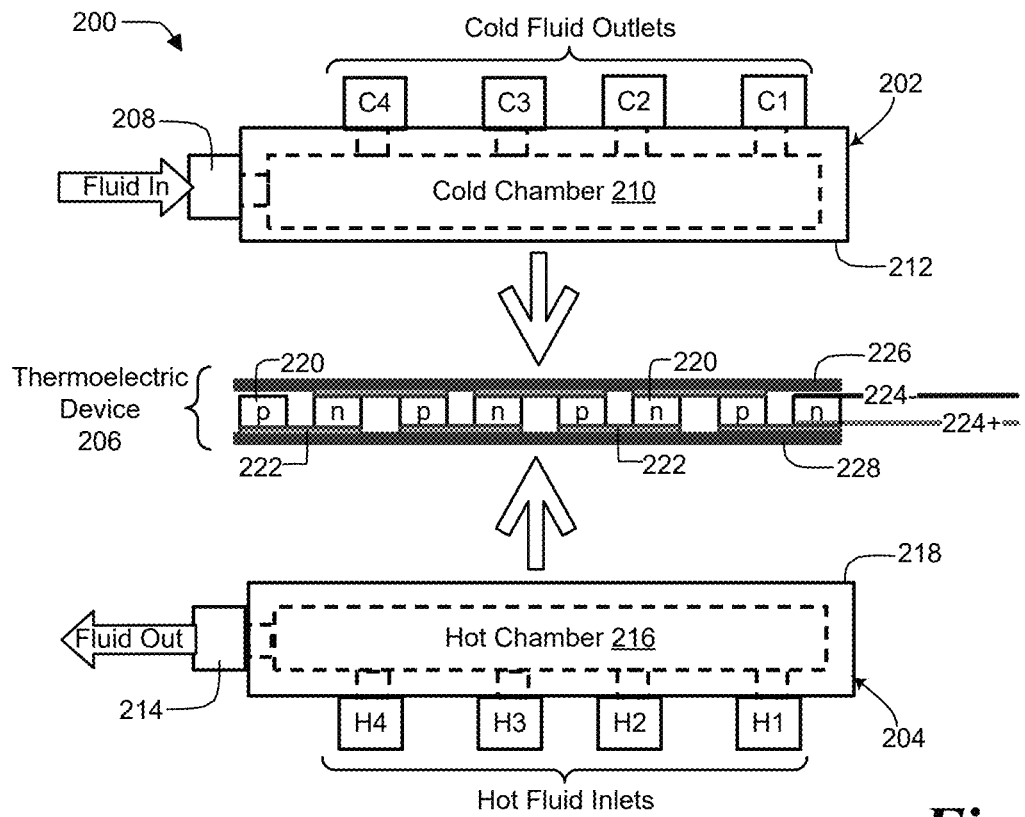
FIGS. 2A-2B are side views or top views of an embodiment of an energy-generating fluid distributor.
Figure 2B:
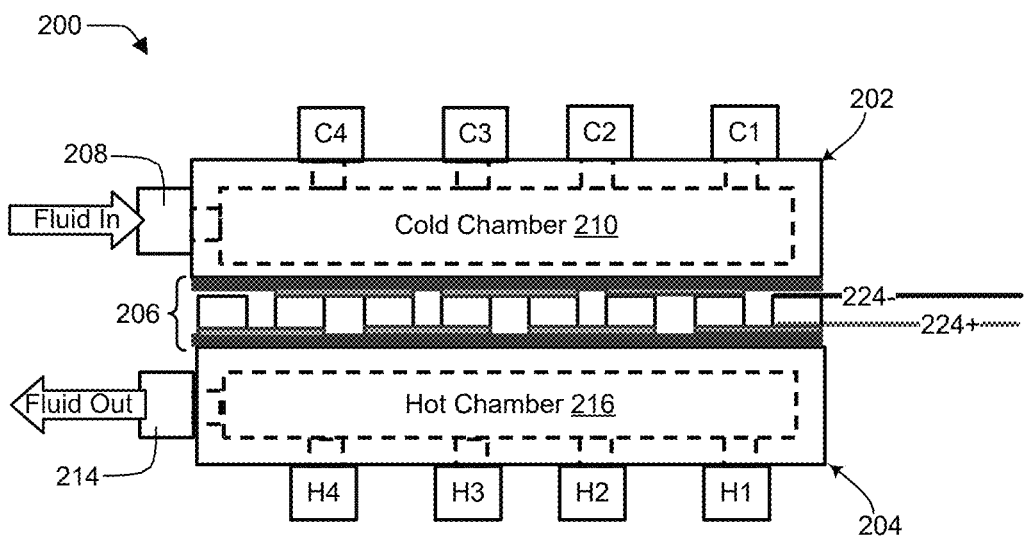

FIGS. 2A-2B together illustrate an embodiment of an energy-generating fluid distributor 200 that can be coupled with a piece of information technology (IT) equipment such as a server to generate electricity while cooling heat-generating components on the server, such as processors, memory, graphics processing units, etc. FIG. 2A is an exploded view, FIG. 2B an assembled view.

Distributor 200 includes three primary components: a cold manifold 202, a hot manifold 204, and a thermoelectric device (TED) 206 sandwiched between the cold manifold and the hot manifold.

Cold manifold 202 functions as a fluid supply distributor and includes a main inlet 208 fluidly coupled to an internal cold chamber 210. The main inlet is used for connecting with fluid supply components (see FIG. 4A-4B). Cold chamber 210 is also fluidly coupled to one or more fluid outlets; in the illustrated embodiment the cold chamber is fluidly coupled to four fluid outlets C1-C4, but other embodiments of cold manifold 202 can include more or less fluid outlets than shown. In embodiments with multiple fluid outlets C, not all the fluid outlets need be used; for instance, if manifold 202 has four fluid outlets C1-C4 but only two are needed, the other two can be capped or otherwise sealed off. In one embodiment, the fluid outlets are designed with dripless quick disconnects so that they are automatically sealed off if not engaged with other connectors. Cold chamber 210 is also in thermal contact with mating surface 212, meaning that heat can be transferred through mating surface 212 into fluid within cold chamber 210. In one embodiment of cold manifold 202, at least mating surface 212 is made of material with high thermal conductivity to aid heat transfer in and out of cold chamber 210; the material can be a metal or a non-metal with high thermal conductivity. In some embodiments mating surface 212 can be made of the same material as the rest of cold manifold 202, but in other embodiments the mating surface can be made of a different material than the rest of the manifold.

Hot manifold 204 functions as a fluid return collector and includes a main outlet 214 fluidly coupled to an internal hot chamber 216. The main outlet is used for connecting with a rack connector in one embodiment (see FIG. 3). Hot chamber 216 is also fluidly coupled to one or more fluid inlets H. In the illustrated embodiment the hot chamber is fluidly coupled to four fluid inlets H1-H4, but other embodiments of hot manifold 204 can include more or less fluid inlets than shown. In embodiments with multiple fluid inlets H not all the fluid inlets need be used; for instance, in an embodiment where manifold 204 has four fluid inlets but only two are needed, the other two can be capped or otherwise sealed off. In one embodiment, the fluid inlets are equipped with blind mating connectors so that they are shut down the fluid if not connected to a mated connector on the other side. Hot chamber 216 is also in thermal contact with mating surface 218, meaning that heat can be transferred through mating surface 218 from fluid within hot chamber 218. In one embodiment of hot manifold 204, at least mating surface 218 is made of material with high thermal conductivity to aid heat transfer out of hot chamber 216; the material can be a metal or a non-metal with high thermal conductivity. In some embodiments mating surface 218 can be made of the same material as the rest of hot manifold 204, but in other embodiments the mating surface can be made of a different material than the rest of the manifold.

Thermoelectric device (TED) 206 includes multiple semiconductor pillars 220 that are electrically connected in series by conductors 222. Semiconductor pillars 220 include alternating p-type and n-type semiconductors electrically connected in series by conductors 222. In one embodiment semiconductors that include different trivalent impurities and pentavalent impurities can be used. The multiple semiconductor pillars 220 are sandwiched between a pair of electrically-insulating layers 226 and 228. In one embodiment, insulating layers 226 and 228 can be made of materials that are thermally conductive but electrically insulating, but other materials can be used in other embodiments. In the illustrated embodiment, TED 206 is shown as a single unit, but in other embodiments TED 206 can be a TED assembly that includes multiple individual TEDs connected in series. In an embodiment with a TED assembly made up of multiple individual TEDs, the semiconductor pillars in individual TEDs can use different types of impurities—one individual TED can use trivalent impurities, another individual TED can use pentavalent impurities, yet another individual TED can use both trivalent and pentavalent impurities, and so on—so that the TED assembly can be tailored to improve electrical generation.

A pair of electrical leads or wires 224, which includes a positive lead 224+ and a negative lead 224−, are electrically coupled to thermoelectric device 206. Thermoelectric device 206 can operate in two modes. In principle, if electricity is supplied to thermoelectric device 206 through leads 224 (i.e., if TED 206 consumes electricity), it operates as a thermoelectric cooler (TEC) that creates a heat flux. If no electricity is supplied to TED 206 but a heat flux is applied across the TED, the device generates electricity—i.e., it operates as a thermoelectric generator: the temperature difference between the cold and hot chambers enables the TED to generate electricity converted from the heat. In the illustrated embodiment, thermoelectric device 206 acts as a thermoelectric generator. TED 206 can thus be used to provide electrical power to other components via leads 224. Although illustrated as a single thermoelectric device, other embodiments of fluid distributor 200 can include multiple thermoelectric devices between the hot and cold manifolds. Thermoelectric devices are commercially available.

To assemble fluid distributor 200, thermoelectric device 206 is sandwiched between cold manifold 202 and hot manifold 204. In one embodiment, to improve heat transfer, hot manifold 204 is below the thermoelectric device and cold manifold 202 is above the thermoelectric device. Cold manifold 202 is coupled to thermoelectric device 206 such that mating surface 212 is in thermal contact with insulating layer 226—i.e., positioned so that heat can travel from one to the other. In one embodiment mating surface 212 can be positioned in direct contact with insulating layer 226, with nothing intervening between them, but in other embodiments material such as a thermal interface material (TIM) can be put between mating surface 212 and insulating layer 226. Similarly, hot manifold 204 is coupled to thermoelectric device 206 such that mating surface 218 is in thermal contact with insulating layer 228—i.e., positioned so that heat can travel from one to the other. In one embodiment mating surface 218 can be positioned in direct contact with insulating layer 228 with nothing intervening between them, but in other embodiments material such as a thermal interface material (TIM) can be put between mating surface 218 and insulating layer 228. In some embodiments cold manifold 202 and hot manifold 204 need not be thermally coupled to thermoelectric device 206 in the same way. For instance, in some embodiments mating surface 212 can be put directly on insulating layer 226 while mating surface 218 is thermally coupled to insulating layer 228 with a thermal interface material. An embodiment of the operation of fluid distributor 200 is described below in connection with FIG. 3.

Figure 3:
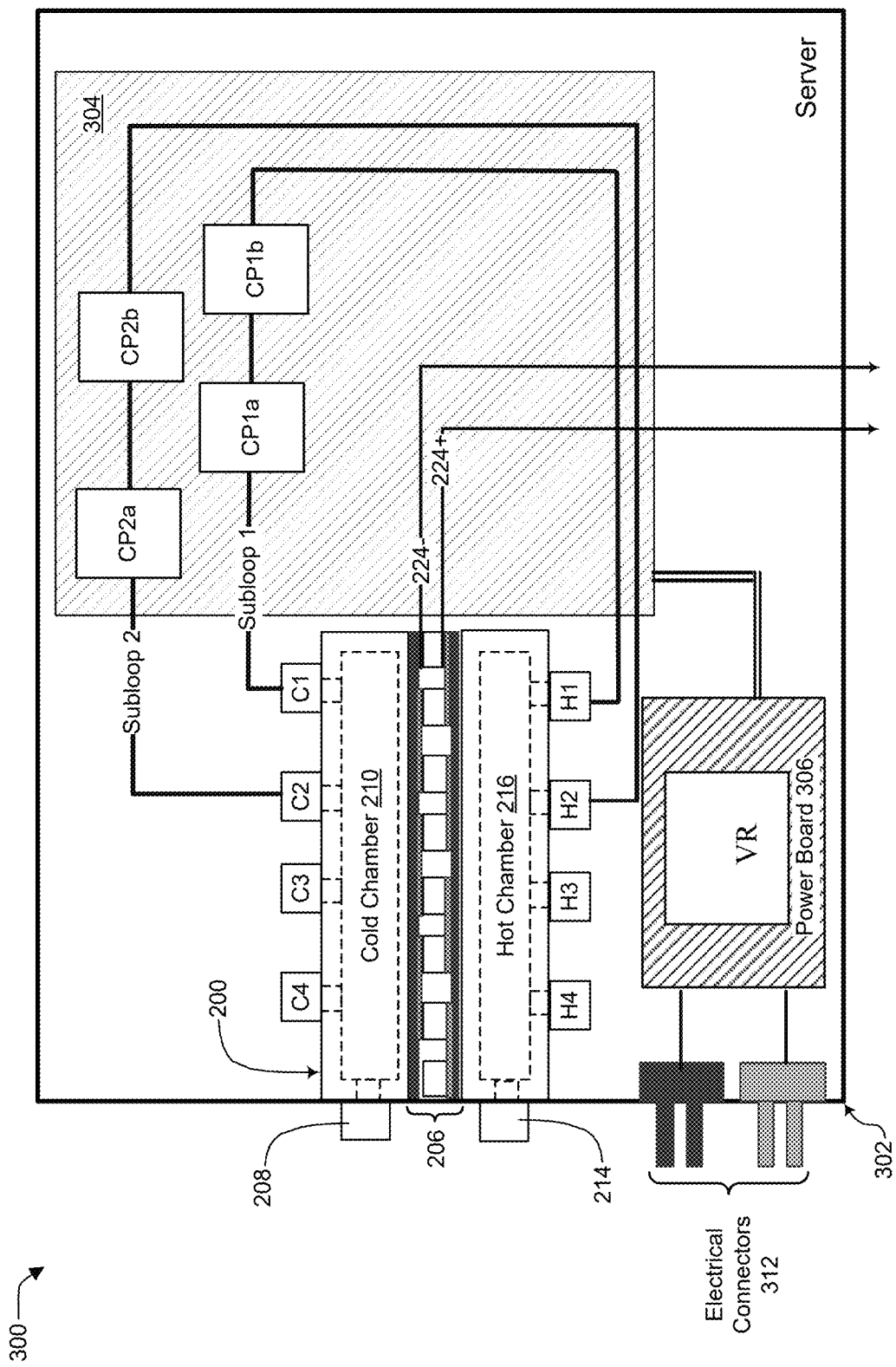
FIG. 3 is a plan view schematic representation of an embodiment of a server using an energy-generating fluid distributor such as the one shown in FIGS. 2A-2B.

FIG. 3 illustrates a server implementation 300 of an embodiment of fluid distributor 200. Server 300 includes a housing 302 within which are housed at least one fluid distributor 200, at least one circuit board 304, a power board 306, and an energy storage unit 308. Circuit board 304 is electrically coupled to power board 306 and energy storage unit 308, while liquid-cooling components on circuit board 304 are fluidly coupled to fluid distributor 200. Fluid distributor 200 is positioned within the housing in a location where it can be connected to fluid delivery components, as shown for example in FIGS. 4A-4B and 5, or to a fluid delivery as shown for instance in FIG. 6

Circuit board 304 has mounted thereon one or more heat-generating components used to operate the server. Examples of heat-generating components that can be found on circuit board 304 include microprocessors (e.g., CPUs), graphics processing units (GPUs), volatile and nonvolatile memory, and so on. At least one of the one or more heat-generating components is thermally coupled to a cooling device such as a cold plate to extract heat from the heat-generating components into fluid flowing through the cold plate. Each cold plate has a fluid inlet through which cooling fluid enters the cold plate and a fluid outlet through which cooling fluid exits the cold plate. The illustrated embodiment of server 300 includes four cold plates (CP1a, CP1b, CP2a, and CP2b) and every heat-generating component is thermally coupled to a cold plate, but other embodiments can include more or less cold plates than shown depending on the circuit board 304 and the corresponding components packaged onto it, and in still other embodiments not every heat-generating component need be thermally coupled to a cold plate. In still other embodiments, cooling devices other than cold plates can be used.

To cool the heat-generating components mounted on board 304, cold plates are thermally coupled to their respective components and fluidly coupled to fluid distributor 200 to form one or more fluid subloops; they are described here as fluid subloops because they are part of a larger fluid loop that can include fluid distributor 200, the rack in which server 300 is located, and the facility in which the rack is located. In the illustrated embodiment, a first subloop, subloop 1, is formed by fluidly coupling outlet C1 to cold plates CP1a and CP1b and to return inlet H1. Similarly, a second subloop, subloop 2, is formed by fluidly coupling supply outlet C2 to cold plates CP2a and CP2b and to return inlet H2. Other embodiments can, of course, have more or less subloops than shown.

In the illustrated embodiment each subloop has two cold plates and in each subloop the cold plates are connected in series, with the outlet of a cold plate connected to the inlet of the next cold plate downstream (e.g., the outlet of CP2a is fluidly coupled to the inlet of CP2b). But other embodiments can include more or less cold plates in each subloop than shown, and in subloops with more than one cold plate the cold plates need not be fluidly coupled in series. For a given temperature difference between hot chamber 216 and cold chamber 210, a higher temperature in the hot chamber will result in greater and more efficient electrical generation from the TED, so that it can be advantageous for the temperature of fluid in the hot chamber to be as high as possible. To increase the temperature in hot chamber 216, in some embodiments, in addition to coupling the cold plates in series it can be advantageous to position cold plates that are thermally coupled to heat-generating components with higher design and operating temperatures furthest downstream in the subloop (i.e., closest to inlets H1-H4) and to position cold plates coupled to heat-generating components with lower design and operating temperatures further upstream in the subloop (i.e., closer to outlet C1-C4). Also in the illustrated embodiment, in each subloop each supply outlet C is fluidly coupled to a corresponding return inlet H: C1 is fluidly coupled to H1, C2 is fluidly coupled to H2, and so on. But in other embodiments subloops can share supply outlets, share return inlets, or share both, so that there need not be a one-to-one correspondence between supply outlets C and return inlets H.

Power board 306 is electrically coupled to a rack busbar (not shown) by electrical connectors 312 and is also electrically coupled to circuit board 304, so that during operation power board 306 can provide electrical power to the components on circuit board 304. Power board 306 can include components that condition the electrical energy received through electrical connectors 312 so that it can be used by components on circuit board 304. In the illustrated embodiment, for instance, power board 306 includes a voltage regulator (VR), but other embodiments of power board 306 can include additional or different electrical conditioning components such as transformers, rectifiers, and the like. Power board 306 supplies DC power to circuit board 304.

Figure 4A:
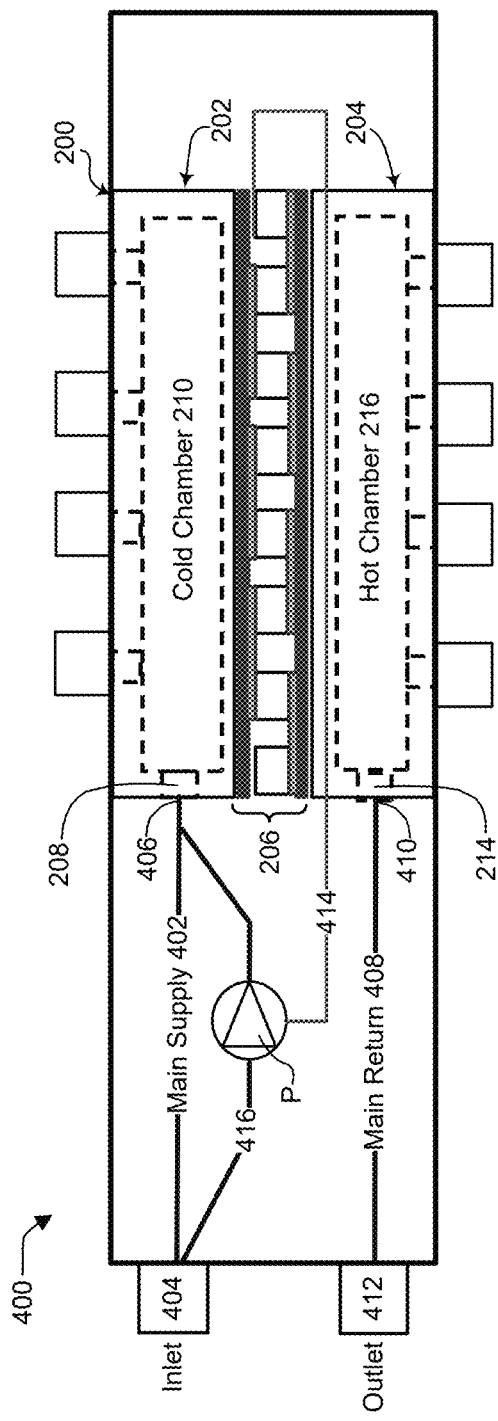
FIGS. 4A-4C are schematic plan views of embodiments of a fluid delivery and distribution system using a fluid distributor such as the one shown in FIGS. 2A-2B.
Figure 4B:
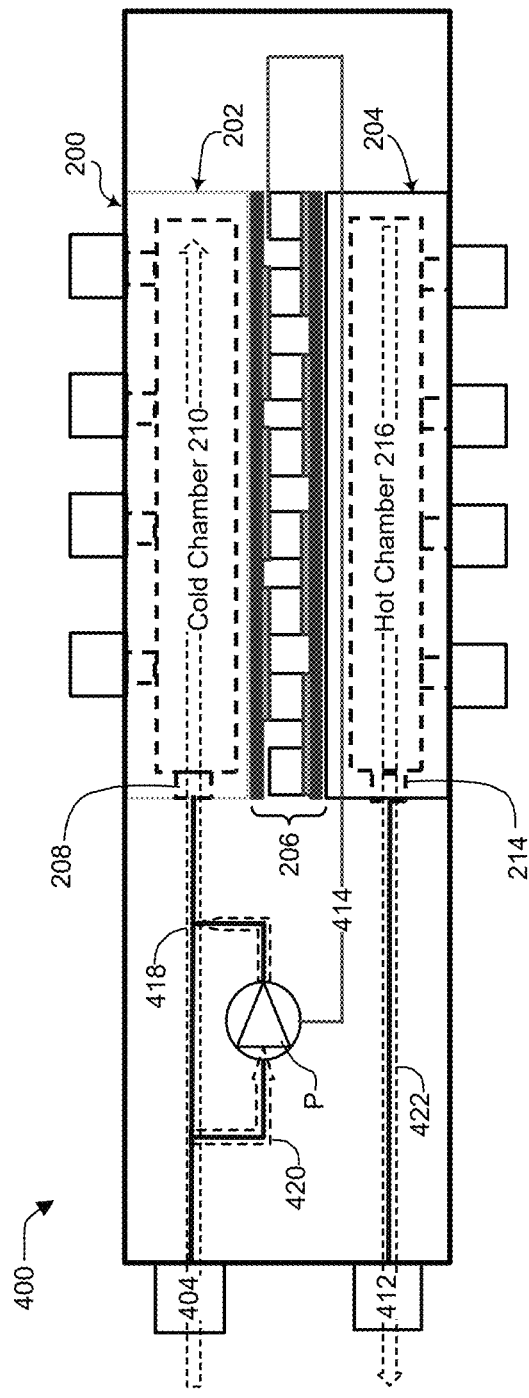

In addition to being thermally coupled to cold chamber 210 and hot chamber 216, thermoelectric device 206 within fluid distributor 200 can also be electrically coupled by electrical connections 224+ and 224− to components within or outside the server requiring electricity (see, e.g., FIGS. 4A-4B et seq.). During operation, cool fluid enters cold chamber 210, flows through the cold plates in each subloop, and returns heated to hot chamber 216. Heat flux between hot chamber 216 and cold chamber 210 goes through thermoelectric device 206, generating electricity that is carried by electrical connections 224+ and 224−. Thermoelectric device 206 thus uses the temperature difference between hot chamber 216 and cold chamber 210 to convert heat energy, which would otherwise be wasted, into electricity. In addition to reclaiming heat energy that would otherwise be wasted, the illustrated embodiment has the advantage that energy transferred from hot chamber 216 to cold chamber 210 reduces the temperature of fluid exiting through main outlet 214. This temperature reduction, which can be significant, results in cooler fluid returning to the rack and the facility, reducing the amount of heat load that needs to be removed by the rack and/or the data center cooling facility.

FIGS. 4A-4B together illustrate an embodiment of a fluid delivery and distribution system 400. FIG. 4A illustrates the main components, FIG. 4B the fluid paths during operation.

System 400 includes fluid distributor 200, with its cold manifold 202, hot manifold 204, and thermoelectric device 206, as described above in connection with FIGS. 2A-2B. A main supply line 402 has a supply line inlet 404 and a supply line outlet 406, and the main supply line is fluidly coupled to distributor 200 by coupling supply line outlet 406 to distributor supply inlet 208. A main return line 408 has a return line inlet 410 and a return line outlet 412, and the main return line is fluidly coupled to distributor 200 by coupling return line inlet 410 to distributor return outlet 214. Main supply inlet 404 can be coupled to an external fluid supply, such as one associated with a rack (see, e.g., FIG. 1) or a data center, and main return outlet 412 can be similarly coupled to an external fluid return, such as one associated with a rack (see, e.g., FIG. 1) or a data center. The TED converts heat from the fluid to electricity, then the hot chamber is cooled which means less heat load applied to the external cooling system. The higher power generated internally directly reflects the hot chamber temperature and heat flux, yielding a fully self-sensing design.

A pump P is fluidly coupled into main supply line 402 and is electrically coupled to thermoelectric device 206 through electrical connection 414. Pump P helps supply fluid to distributor 200 and is powered by thermoelectric device 206 within the distributor. Generally, pump P can be a pump with high reliability (i.e., high mean time between failures (MTBF)) and that can operate at the voltages and currents output by thermoelectric device 206. In the illustrated embodiment pump P is coupled into a bypass line 416 and the ends of bypass line 416 are both fluidly coupled to main supply line 402. In this embodiment the main supply can be understood as a passive loop and the pump is only used for accelerating the fluid, so that in this configuration pump P is a boost pump: fluid can flow through main supply line 402 into distributor 200 even if pump P is not operating, but if an acceleration of the flow—i.e., increase in pressure or flow rate into distributor supply inlet 208—is needed, then the pump can be activated to boost pressure and flow rate into distributor 200. The operation of pump P need not be binary on/off operation; in some embodiments, the pump speed can vary continuously, from 0 percent to 100 percent, depending on the voltage or current supplied to it by thermoelectric device 206. Although shown as a single line, electrical connection 414 can include two or more electrical lines, such as a positive and negative electrical line, as illustrated by leads 224 in FIGS. 2A-2B and 3.

FIG. 4B illustrates the flow paths of cooling fluid during operation of system 400. As illustrated by dashed arrow 418, cooling fluid enters through inlet 404 and flows through main supply line 402 (not labeled in this figure) and inlet 208 into cold chamber 210. From cold chamber 210 the fluid is distributed to cold plates thermally coupled to heat-generating components in the server, as shown in FIG. 3. In the illustrated embodiment pump P functions as a boost pump, so that when the pump is running fluid flows through main supply line 402 and simultaneously flows through bypass line 416 and pump P into main supply line 402; this is illustrated by dashed arrow 420. As illustrated by dashed arrow 422, hot fluid from hot chamber 216 flows through outlet 214, into main return line 408 (not labeled in this figure), and out through outlet 412.

An advantage of this embodiment is that it is self-regulating. No control is needed because the pump is automatically powered by the TEC which fully depends on the thermal load between the hot chamber and cold chamber. The speed of pump P, and hence the pressure and flow rate of entering cooling fluid, automatically adjusts based on the temperature within hot chamber 216 and the temperature difference between hot chamber 216 and cold chamber 210. For example, if the heat-generating components on the server (see, e.g., FIG. 3) generate more heat, hot chamber 216 gets hotter and the temperature difference between the hot and cold chambers increases. As a result, thermoelectric device 206 generates more electricity and drives pump P at a higher rate, which directs directing more fluid into the system to cool the components, thus reducing the temperature in hot chamber 216 and the reducing the temperature difference between hot and cold chambers. Similarly, if the heat-generating components generate less heat, the temperature within hot chamber 216, and the temperature difference between the hot and cold chambers, decreases so that thermoelectric device 206 generates less electricity and drives pump at a lower speed, thus directing less cooling fluid into cold chamber 210 and to cold plates attached the heat-generating components. The self-regulation happens without the need for sensors, controllers, and associated software, but of course in other embodiments sensors, controllers, software, and other such components can be used. An equilibrium is achieved without any additional control and operation.

Figure 4C:
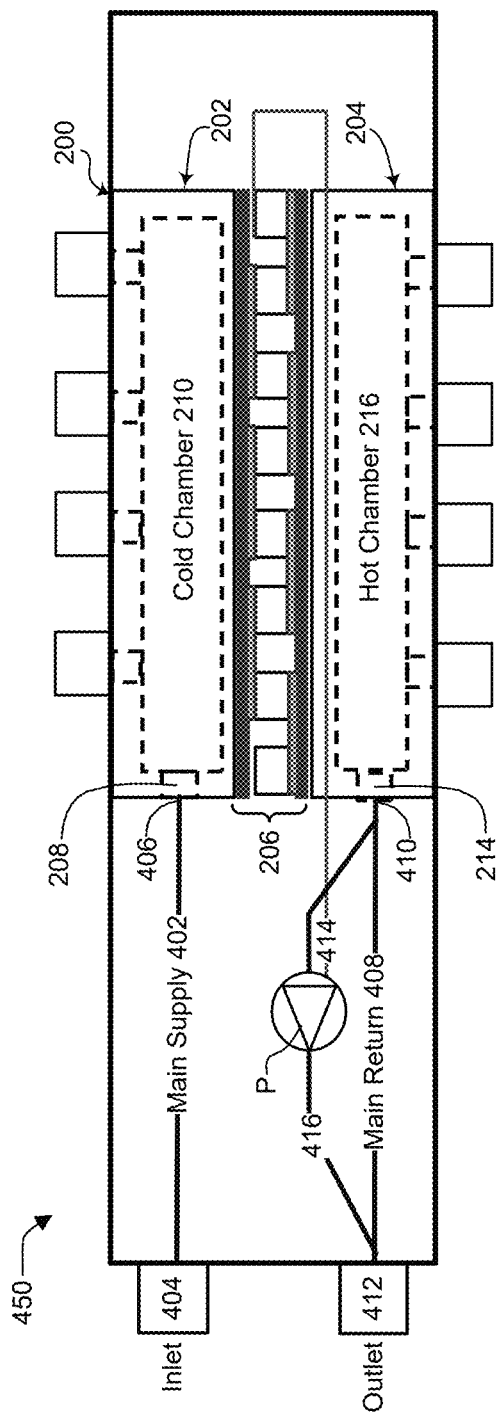

FIG. 4C illustrates another embodiment of a fluid delivery and distribution system 450. System 450 is in most respects like fluid delivery and distribution system 400 and includes the same or similar components. The primary difference between systems 400 and 450 is that in system 450 pump P is fluidly coupled into main return line 408 instead of main supply line 402, so that pump P acts as a boost pump that can be used to increase the pressure and flow rate in main return line 408 instead of main supply line 402. In an embodiment where supply line inlet 404, return line outlet 412, supply line outlet 406, and return line inlet 410 all have the same type of fluid connector, the configuration can be easily changed from the configuration of system 400 to the configuration of system 450 by rotating the fluid delivery unit 180 degrees, so that supply line inlet 404 is fluidly connected to the hot chamber and return line outlet 412 is fluidly connected to the cold inlet to put the boost pump P in the return line instead of the supply line.

Figure 5A:
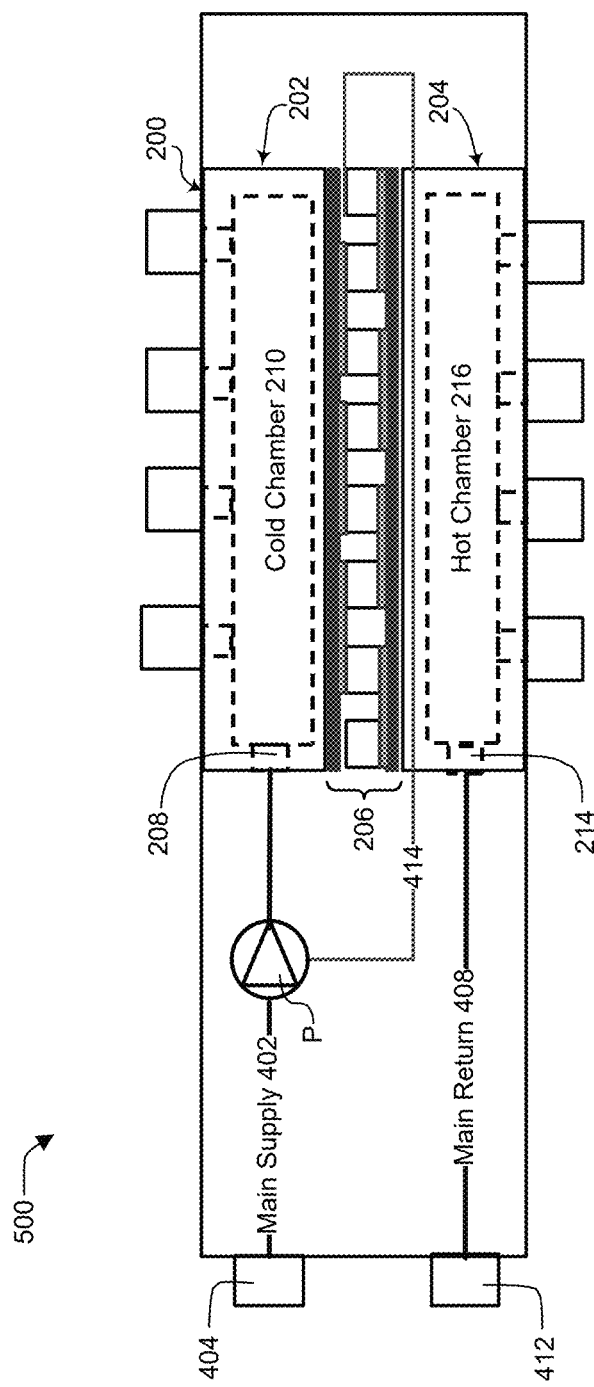
FIGS. 5A-5B are schematic plan views of other embodiments of a fluid delivery and distribution system.

FIG. 5A illustrates another embodiment of a fluid delivery and distribution system 500. System 500 is in most respects similar to system 400: it includes fluid distributor 200, with its cold manifold 202, hot manifold 204, and thermoelectric device 206, as described above in connection with FIGS. 2A-2B. A main supply line 402 has a supply line inlet 404 and a supply line outlet 406, and the main supply line is fluidly coupled to distributor 200 by coupling supply line outlet 406 to distributor supply inlet 208. A main return line 408 has a return line inlet 410 and a return line outlet 412, and the main return line is fluidly coupled to distributor 200 by coupling return line inlet 410 to distributor return outlet 214. Main supply inlet 404 can be coupled to an external fluid supply, such as one associated with a rack or a data center, and similarly main return outlet 412 can be coupled to an external fluid return, such as one associated with a rack or a data center.

The primary difference between systems 500 and 400 is that in system 500 pump P is fluidly coupled directly into main supply line 402 so that the supply is more active than passive. As in system 400, in system 500 pump P is electrically coupled to thermoelectric device 206 through electrical connection 414. Thus, pump P supplies fluid to distributor 200 and is powered by thermoelectric device 206 within the distributor. Generally, pump P can be a pump with high reliability (i.e., high mean time between failures (MTBF)) and that can operate at the voltages and currents output by thermoelectric device 206. In the illustrated embodiment pump P directly coupled into main supply line 402. In this embodiment, then, pump P is an active pump: it operates continuously to supply fluid into cold manifold 202, and fluid does not flow through main supply line 402 if pump P is not operating. Because in this embodiment the pump is constantly operating, a thermoelectric device more advanced than the one shown in FIGS. 4A-4B can be designed.

As in system 400, in system 500 operation of pump P need not be binary on/off operation; in some embodiments, the pump speed can vary continuously, between 0 percent and 100 percent, depending on the voltage or current supplied by thermoelectric device 206. Although shown in the figure as a single line, electrical connection 414 can include two or more electrical lines, such as positive and negative electrical lines, as illustrated by leads 224 in FIGS. 2A-2B and 3. Operation of system 500 is similar to the operation of system 400, except that because system 500 lacks bypass line 416 fluid is supplied only through main supply line 402. System 500 is also self-regulating, as described above.

Figure 5B:
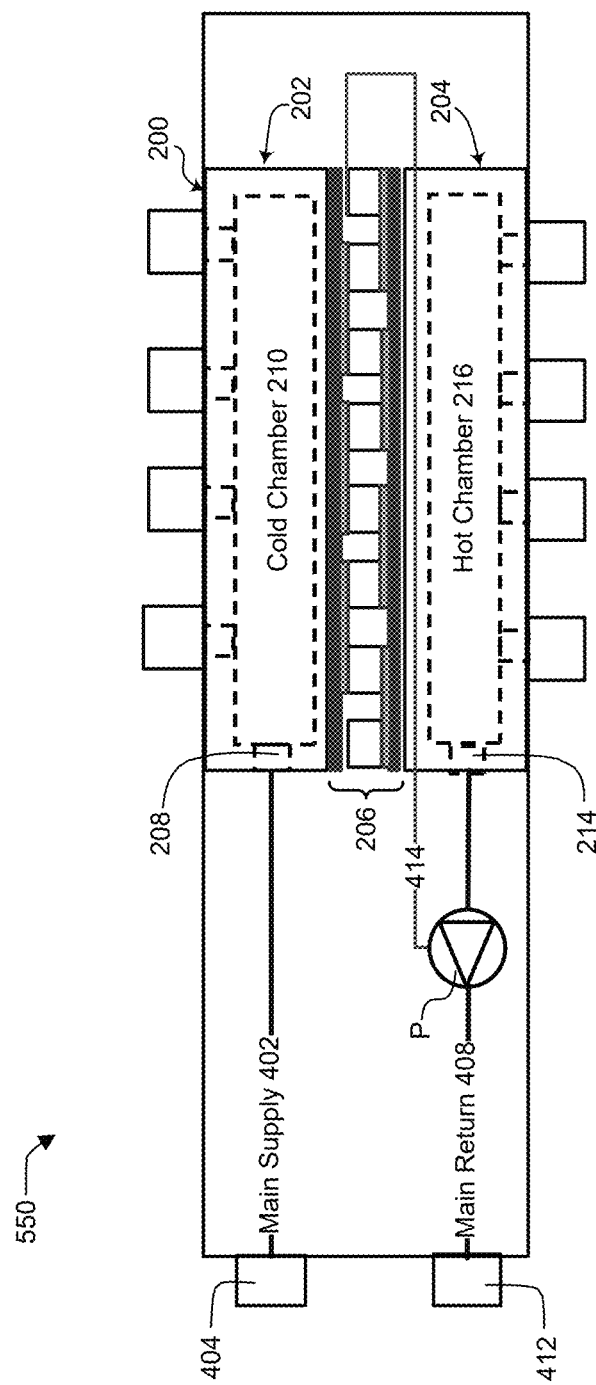

FIG. 5B illustrates another embodiment of a fluid delivery and distribution system 550. System 550 is in most respects like fluid delivery and distribution system 500 and includes the same or similar components. The primary difference between systems 500 and 550 is that in system 450 pump P is fluidly coupled into main return line 408 instead of main supply line 402, so that pump P acts as an active pump that can be used to increase the pressure and flow rate in main return line 408 instead of main supply line 402. In an embodiment where supply line inlet 404, return line outlet 412, supply line outlet 406, and return line inlet 410 all have the same type of fluid connector, the configuration can be easily changed from the configuration of system 500 to the configuration of system 550 by rotating the fluid delivery unit 180 degrees, so that supply line inlet 404 is fluidly connected to the hot chamber and return line outlet 412 is fluidly connected to the cold inlet to put the boost pump P in the return line instead of the supply line.

Figure 6:
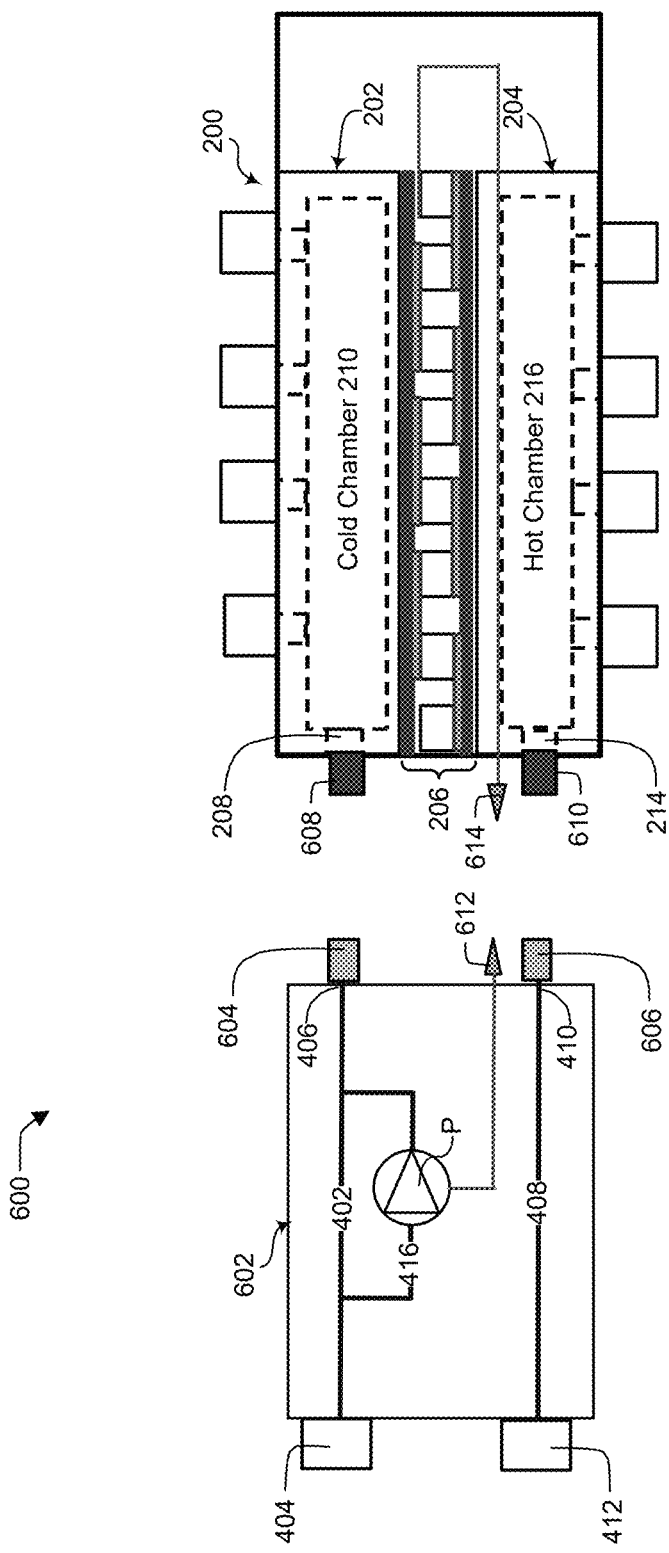
FIG. 6 is a schematic plan view of an embodiment of the fluid delivery and distribution system of FIGS. 4A-4B in which some components are grouped into a fluid delivery module.

FIG. 6 illustrates an embodiment of a fluid delivery and distribution system 600. System 600 is in most respects similar to system 400. The primary difference between systems 400 and 600 is that in system 600 some components have been grouped into a fluid delivery module 602; a similar modular grouping can be done with systems 450, 500, and 550. Grouping these components into a fluid delivery module makes it easy to swap components, for instance if pump P needs to be upgraded, repaired, or replaced. This embodiment can be more easily configured because different pumps can be connected and different fluid loops, such as passive loops or active loops, can be designed.

In the illustrated embodiment, fluid delivery module 602 includes main supply line 402, bypass line 416, pump P, and main return line 408. As in system 400, main supply line 402 includes a supply line inlet 404 and a supply line outlet 406, and main return line 408 includes return line inlet 410 and return line outlet 412. Other embodiments of delivery module 602 can use the active pump configuration shown in FIG. 5.

To make delivery module 602 easy to connect to distributor 200, the delivery module is equipped with various fluid couplings and electrical connectors. Main outlet coupling 604 is coupled to supply line outlet 406, and main inlet coupling 606 is coupled to return line inlet 410. In one embodiment, fluid couplings 604 and 606 can be dripless blind-mating connectors, but in other embodiments they can be other types of connectors such as quick-disconnect connectors. To couple fluid delivery module 602 to distributor 200 and establish the necessary fluid connections, main outlet coupling 604 is coupled to a corresponding inlet coupling 608 on inlet 208 of the distributor; similarly, main inlet coupling 606 is coupled to a corresponding outlet coupling 610 on outlet 214 of the distributor. In some embodiments of fluid delivery module 602 the fluid connections and electrical port can be made symmetric, so that module 602 can be quickly reoriented to move pump P, whether it is a boost pump or an active pump, from the main supply line to the main return line. Thus, the module can be quickly reoriented to change the configuration from system 400 to system 450 and vice versa, or to change the configuration from system 500 to system 550 and vice versa.

In addition to its fluid couplings, delivery module 602 is furnished with an electrical connector 612 that is electrically coupled to pump P. Module 200 is similarly furnished with an electrical connector 614 that is electrically coupled to thermoelectric device 206. To establish electrical connections between delivery module 602 and distributor 200, delivery module 602 is coupled to distributor 200 so that electrical connector 612 mates with connector 614, thus providing an electrical path between thermoelectric device 206 and pump P.

In one embodiment, main supply inlet 404 can be provided with a fluid coupling that allows it to be easily coupled to an external fluid supply, such as one associated with a rack or a data center, and main return outlet 412 can be provided with a fluid coupling that allows it to be easily coupled to an external fluid return, such as one associated with a rack or a data center. In in an embodiment where main supply inlet 404 and main return inlet 412 include fluid couplings, they can be, but need not be, the same type of couplings as fluid couplings 604 and 606.

Figure 7:
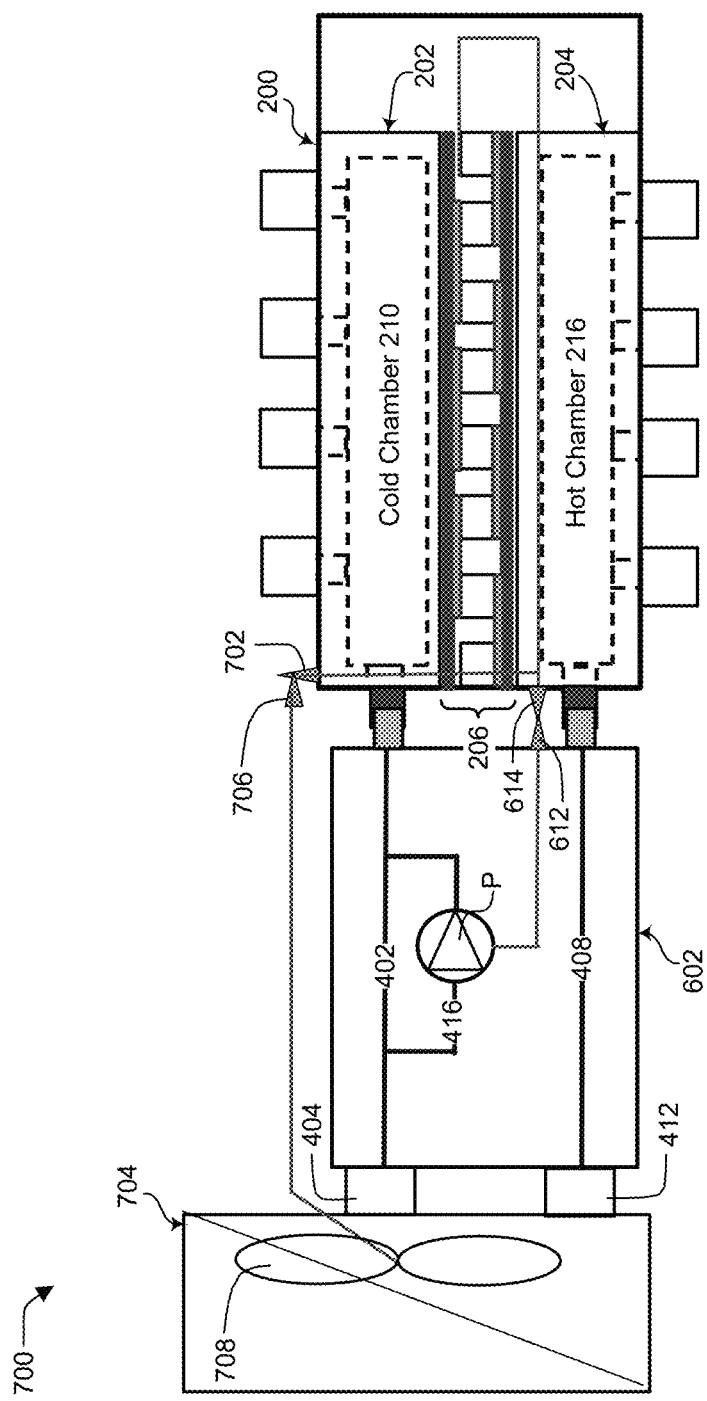
FIG. 7 is a schematic plan view of another embodiment of a fluid delivery and distribution system.

FIG. 7 illustrates an embodiment of a fluid delivery and distribution system 700. System 700 is in most respects similar to system 600. The primary difference between systems 600 and 700 is that system 700 includes additional electrical connectors so that other components in addition to pump P can be electrically powered by thermoelectric device 206.

In the illustrated embodiment, fluid delivery module 602 is as described above for system 600: it includes main supply line 402, bypass line 416, pump P, and main return line 408. Other embodiments of delivery module 602 can use the pump configurations associated with systems 450, 500, or 550. Main supply line 402 has a supply line inlet 404 and a supply line outlet 406, and main return line 408 has a return line inlet 410 and a return line outlet 412. Main outlet coupling 604 is positioned at supply line outlet 406, and main inlet coupling 606 is positioned at return line inlet 410. To couple fluid delivery module 602 to distributor 200 and establish the fluid connections, main outlet coupling 604 is coupled to a corresponding inlet coupling 608 on inlet 208 of the distributor, and similarly main inlet coupling 606 is coupled to a corresponding outlet coupling 610 on outlet 214 of the distributor.

In addition to its fluid couplings, delivery module 602 is furnished with an electrical connector 612 that is electrically coupled to pump P. In the illustrated embodiment distributor 200 is furnished with two electrical connectors: a connector 614 electrically coupled to thermoelectric device 206, as in system 600, and at least one additional electrical connector 702 that is also electrically coupled to thermoelectric device 206. Electrical connector 612 mates with connector 614 to establish an electrical path between thermoelectric device 206 and pump P. Additional electrical connector 702 can be used to establish an electrical path between thermoelectric device 206 and an additional component, so that both pump P and the additional component can be powered by the thermoelectric device 206.

In system 700, the component powered through additional connector 702 is a liquid-to-air heat exchanger 704 that is fluidly coupled to main supply inlet 404 and main return outlet 412. In one use case, the illustrated embodiment of system 700 can function as a closed cooling loop. The liquid-to-air heat exchanger includes a fan 708 that is electrically coupled to an electrical connector 706. Electrical connector 706 is adapted to be coupled to electrical connector 702, so that thermoelectric device 206 can provide electrical power to fan 708. In other embodiments of system 700, liquid-to-air heat exchanger 704 can include other electrically-driven components besides fan 708, and in still other embodiments of system 700 the additional component 704 can, of course, be a component other than a liquid-to-air heat exchanger.

Figure 8:
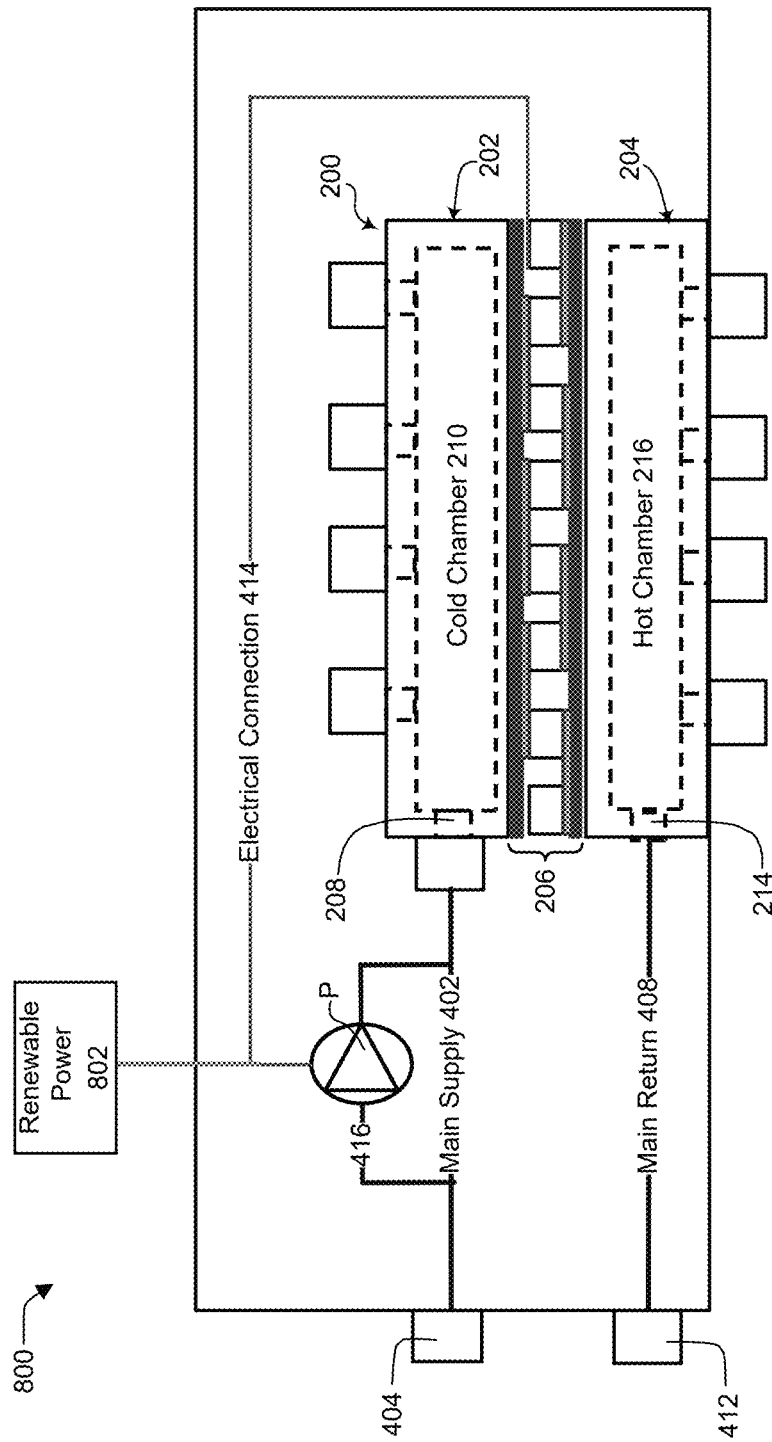
FIG. 8 is a schematic plan view of another embodiment of a fluid delivery and distribution system.

FIG. 8 illustrates an embodiment of a fluid delivery and distribution system 800. System 800 is in most respects similar to system 400: it includes fluid distributor 200, with its cold manifold 202, hot manifold 204, and thermoelectric device 206, as described above in connection with FIGS. 2A-2B. A main supply line 402 has a supply line inlet 404 and a supply line outlet 406, and the main supply line is fluidly coupled to distributor 200 by coupling supply line outlet 406 to distributor supply inlet 208. A main return line 408 has a return line inlet 410 and a return line outlet 412, and the main return line is fluidly coupled to distributor 200 by coupling return line inlet 410 to distributor return outlet 214. Main supply inlet 404 can be coupled to an external fluid supply, such as one associated with a rack or a data center, and similarly main return outlet 412 can be coupled to an external fluid return, such as one associated with a rack or a data center. Embodiments of system 800 can also be configured similarly to systems 450, 500, and 550.

The primary difference between systems 800 and 400 is that in system 800 pump P, in addition to being electrically coupled to thermoelectric device 206 by electrical connection 414, is electrically coupled to a renewable power source 802 outside the server. In one embodiment, renewable power source 802 can be electrically coupled to pump P using a dedicated renewable power interface. In various embodiments renewable power source 802 can be a solar power source, a wind-driven power source, or any other source or combination of sources of renewable electrical power. Thus, in system 800 pump P can be powered both internally by thermoelectric device 206, externally by a renewable power source, or both. This enables more availability for the module by utilizing renewable power. In a modular design, such as the one shown in FIG. 6, a renewable power interface can be designed on the delivery module to provide a connection to renewable power source 802.

Figure 9:
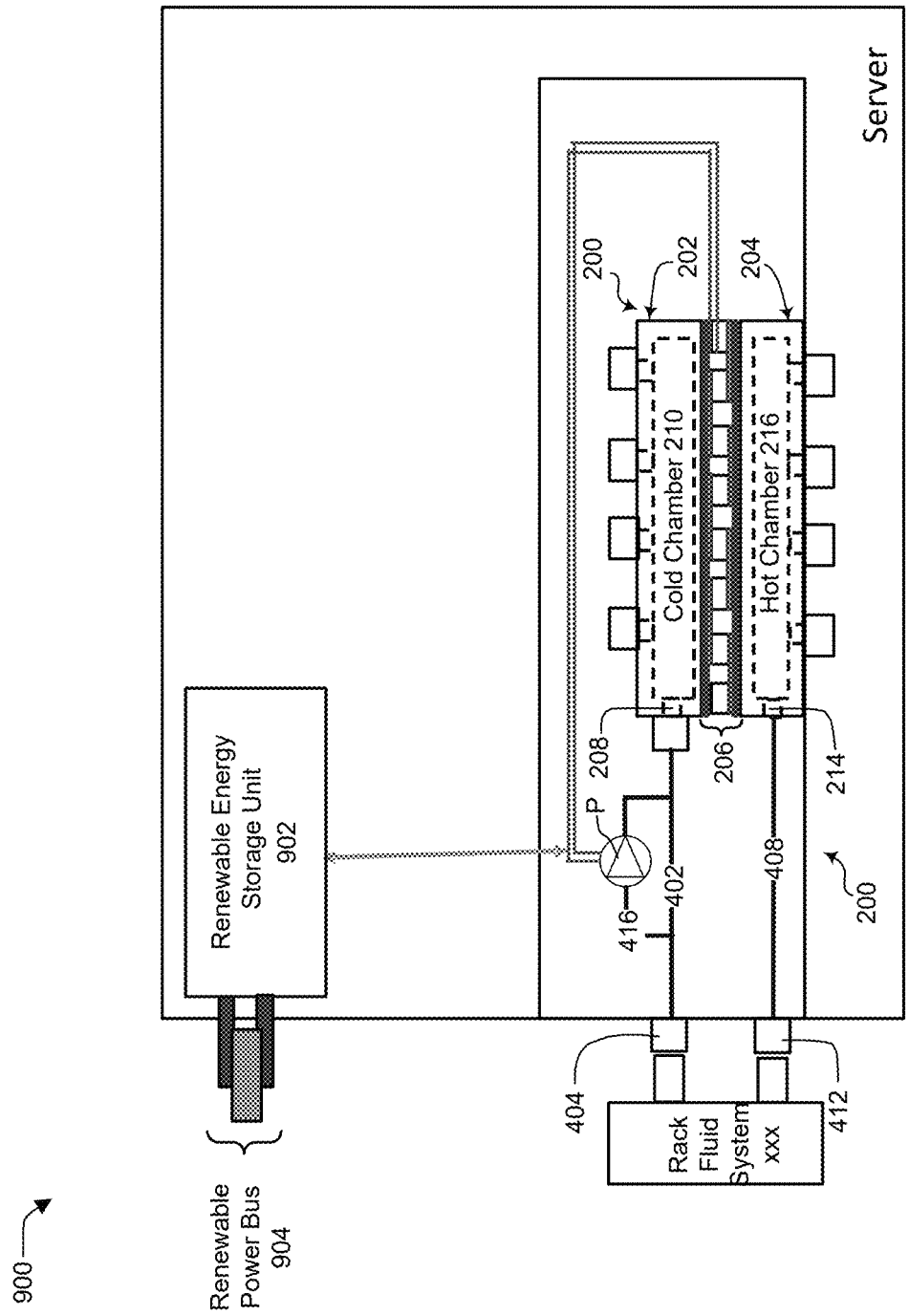
FIG. 9 is a schematic plan view of another embodiment of a fluid delivery and distribution system.

FIG. 9 illustrates an embodiment of a fluid delivery and distribution system 900. System 900 is in most respects similar to system 800: it includes fluid distributor 200, with its cold manifold 202, hot manifold 204, and thermoelectric device 206, as described above in connection with FIGS. 2A-2B. A main supply line 402 has a supply line inlet 404 and a supply line outlet 406, and the main supply line is fluidly coupled to distributor 200 by coupling supply line outlet 406 to distributor supply inlet 208. A main return line 408 has a return line inlet 410 and a return line outlet 412, and the main return line is fluidly coupled to distributor 200 by coupling return line inlet 410 to distributor return outlet 214. Main supply inlet 404 can be coupled to an external fluid supply, such as one associated with a rack or a data center, and similarly main return outlet 412 can be coupled to an external fluid return, such as one associated with a rack or a data center.

The primary difference between system 800 and 900 is that in system 900 pump P, in addition to being electrically coupled to thermoelectric device 206, is electrically coupled to a renewable energy storage unit 902. In one embodiment storage unit 902 can be a battery, but in other embodiments it can be a different type of energy storage unit. Renewable energy storage unit 902 is in turn electrically coupled to a renewable power bus 904. Energy storage unit 902 can be charged by one or both of the renewable power bus 904 and thermoelectric device 206.

Pump P is powered by both the thermoelectric device 206 and the renewable energy storage unit 902. In one embodiment renewable energy storage unit 902 can be extended to be designed and deployed as a rack base unit. It can be seen that the embodiment partially or entirely eliminates use of utility power for the server cooling system. And with proper design, the thermal load can be efficiently used by the thermoelectric device and much less heat load delivered to the external cooling (rack or data center) loop. The overall design increases the power efficiency by self-powered server cooling fluid recirculating and utilizing the heat load instead of transferring it to the atmosphere.

Other embodiments are possible besides the ones described above. For instance:

More hardware components can be packaged within the module and powered by the module.

The solution can be packaged for different server cooling designs.

The unit can be packaged for supporting multiple nodes or cooling modules.

The above description of embodiments is not intended to be exhaustive or to limit the invention to the described forms. Specific embodiments of, and examples for, the invention are described herein for illustrative purposes, but various modifications are possible.

What is claimed is:

1. An apparatus comprising:
   an energy-generating fluid distributor comprising:
   a hot manifold including a hot chamber fluidly coupled to a plurality of fluid return inlets and a distributor return outlet, the hot manifold being adapted to receive a working fluid through the plurality of fluid return inlets and direct the working fluid to the distributor return outlet,
   a cold manifold including a cold chamber fluidly coupled to a distributor supply inlet and a plurality of fluid supply outlets, the cold manifold being adapted to receive the working fluid through the distributor supply inlet and direct the working fluid to the plurality of fluid supply outlets, and
   a thermoelectric device sandwiched between the hot manifold and the cold manifold and in thermal contact with the hot chamber and the cold chamber, wherein the thermoelectric device generates electricity;
   a cooling subloop that is fluidly coupled from one of the plurality of fluid supply outlets to one of the plurality of fluid return inlets so that the working fluid flowing in the cooling subloop bypasses the thermoelectric device;
   a main supply line having a supply line inlet and a supply line outlet fluidly coupled to the distributor supply inlet; and
   a main return line having a return line inlet and a return line outlet fluidly coupled to the distributor return outlet.

2. The apparatus of claim 1, wherein the main supply line includes a pump fluidly coupled therein, the pump being electrically coupled to the thermoelectric device.

3. The apparatus of claim 2, wherein the pump is a boost pump coupled in a bypass line, wherein ends of the bypass line are fluidly coupled to the main supply line or wherein the ends of the bypass line are fluidly coupled to the main return line.

4. The apparatus of claim 2, wherein the pump is an active pump directly coupled in the main supply line or the main return line.

5. The apparatus of claim 2, wherein the main supply line, the pump, and the main return line are grouped in a fluid delivery module separate from the energy-generating fluid distributor.

6. The apparatus of claim 5, wherein the fluid delivery module further comprises fluid couplings coupled to at least the supply line outlet and the return line inlet, wherein the fluid couplings is adapted to couple the supply line outlet to the distributor supply inlet and couple the return line inlet to the distributor return outlet.

7. The apparatus of claim 5, wherein the fluid delivery module further comprises at least one pump power connector electrically coupled to the pump and adapted to connect with a corresponding connector on the fluid distributor that is electrically coupled to the thermoelectric device.

8. The apparatus of claim 5, wherein the supply line outlet and the return line inlet are coupled to the energy-generating fluid distributor using standard electrical and fluid connectors.

9. The apparatus of claim 5, wherein the fluid distributor includes one or more additional power connectors coupled to the thermoelectric device and adapted to be coupled with corresponding connectors of additional electrically-powered cooling components.

10. The apparatus of claim 9, further comprising a liquid-to-air heat exchanger coupled to the supply line inlet and the return line outlet, the liquid-to-air heat exchanger including a fan coupled to one of the additional power connectors of the fluid distributor.

11. The apparatus of claim 1, wherein the thermoelectric device is further electrically coupled to an external renewable power source.

12. The apparatus of claim 1, wherein the thermoelectric device is further electrically coupled to a renewable energy storage unit in a server in which the energy-generating fluid distributor is located.

13. A cooling system, comprising:
one or more cold plates adapted to be thermally coupled to a corresponding one of one or more heat-generating components in a piece of information technology (IT) equipment, each cold plate having a fluid inlet and a fluid outlet;
an energy-generating fluid distributor comprising:
a hot manifold including a hot chamber fluidly coupled to a plurality of fluid return inlets and a distributor return outlet, the hot manifold being adapted to receive a working fluid through the plurality of fluid return inlets and direct the working fluid to the distributor return outlet,
a cold manifold including a cold chamber fluidly coupled to a distributor supply inlet and a plurality of fluid supply outlets, the cold manifold being adapted to receive the working fluid through the distributor supply inlet and direct the working fluid to the plurality of fluid supply outlets, and
a thermoelectric device sandwiched between the hot manifold and the cold manifold and in thermal contact with the hot chamber and the cold chamber, wherein the thermoelectric device generates electricity;
one or more cooling subloops formed by fluidly coupling at least one of the one or more cold plates to the cold chamber though one of the plurality of fluid supply outlets and to the hot chamber through one of the plurality of fluid supply inlets;
a main supply line having a supply line inlet and a supply line outlet fluidly coupled to the distributor supply inlet; and
a main return line having a return line inlet and a return line outlet fluidly coupled to the distributor return outlet.

14. The cooling system of claim 13, wherein the main supply line includes a pump fluidly coupled therein, the pump being electrically coupled to the thermoelectric device.

15. The cooling system of claim 14, wherein the pump is a boost pump coupled in a bypass line, wherein ends of the bypass line are fluidly coupled to the main supply line or wherein the ends of the bypass line are fluidly coupled to the main return line.

16. The cooling system of claim 14, wherein the pump is an active pump directly coupled in the main supply line or the main return line.

17. The cooling system of claim 14, wherein the main supply line, the pump, and the main return line are grouped in a fluid delivery module separate from the energy-generating fluid distributor.

18. The cooling system of claim 17, wherein the fluid delivery module further comprises fluid couplings coupled to at least the supply line outlet and the return line inlet, wherein the fluid couplings is adapted to couple the supply line outlet to the distributor supply inlet and couple the return line inlet to the distributor return outlet.

19. The cooling system of claim 17, wherein the fluid delivery module further comprises at least one pump power connector electrically coupled to the pump and adapted to connect with a corresponding connector on the fluid distributor that is electrically coupled to the thermoelectric device.

20. The cooling system of claim 17, wherein the supply line outlet and the return line inlet are coupled to the energy-generating fluid distributor using standard electrical and fluid connectors.

* * * * *